United States Patent [19]
Kaaden et al.

[11] Patent Number: 5,940,449
[45] Date of Patent: Aug. 17, 1999

[54] SIGNAL PROCESSING SYSTEM FOR DIGITAL SIGNALS

[75] Inventors: Jürgen Kaaden; Dietmar Bräuer; Gerhard Reiner, all of Villingen-Schwenningen, Germany

[73] Assignee: Deutsche Thomson-Brandt GmbH, Villingen-Schwenningen, Germany

[21] Appl. No.: 08/642,663

[22] Filed: May 3, 1996

[30] Foreign Application Priority Data

May 16, 1995 [DE] Germany .......................... 195 17 405

[51] Int. Cl.⁶ ............................. H03M 13/12; H04L 7/00
[52] U.S. Cl. ..................... 375/341; 375/290; 371/43.7; 360/51
[58] Field of Search .................................. 375/262, 263, 375/264, 290, 340, 341; 371/43.6, 43.7; 360/46, 51, 65

[56] References Cited

U.S. PATENT DOCUMENTS

| | | | |
|---|---|---|---|
| 5,136,616 | 8/1992 | Dent | 375/341 |
| 5,166,955 | 11/1992 | Ohta | 375/290 X |
| 5,432,820 | 7/1995 | Sugawara et al. | 375/341 |
| 5,550,870 | 8/1996 | Blaker et al. | 375/341 |
| 5,568,330 | 10/1996 | Sawaguchi et al. | 360/46 |
| 5,625,632 | 4/1997 | Ishida et al. | 371/40.14 |
| 5,675,565 | 10/1997 | Taguchi et al. | 369/59 |
| 5,768,321 | 6/1998 | Watanabe et al. | 375/344 |

FOREIGN PATENT DOCUMENTS

| | | | |
|---|---|---|---|
| 0644661 | 3/1995 | European Pat. Off. | H03M 13/12 |
| 3524145 | 8/1987 | Germany | H04L 27/22 |
| 4102800 | 8/1992 | Germany | H03L 7/06 |

*Primary Examiner*—Young T. Tse
*Attorney, Agent, or Firm*—Joseph S. Tripoli; Frederick A. Wein; Ronald H. Kurdyla

[57] ABSTRACT

In digital, magnetic and optical storage systems for audio/video/data, a Viterbi detector is extended by a control output, and a PLL is controlled by a variable delay line at the output or inside of the PLL.

3 Claims, 3 Drawing Sheets optimale Abtastpunkte

SIGNAL PROCESSING SYSTEM FOR DIGITAL SIGNALS

BACKGROUND

In digital, magnetic and optical storage systems for audio/video/data, PLL (Phase Locked Loop) systems are used in playback mode for the purpose of resynchronizing the clock pulse from the data. For the purpose of reconverting the digital data from the analog-sampled signals, provision is made, in these systems, for decision devices which, in the case of the novel systems such as DVC (recording on tape) or DVD (optical playback), are designed as Viterbi detectors in a self-adapting form which is optimally matched to the type of storage medium. The Viterbi detector operates in general in a digital fashion, that is to say the signal which is present in analog form is digitized with the aid of an A/D (analog/digital) converter and fed to the detector.

It is disadvantageous in this case that the sampling instant is influenced by the response of the PLL and the equalization. It is, furthermore, dependent on distortions which have ocurred during the recording, as well as on the thermal response of the electronics. In reality, a variance of approximately 10% is to be expected. A non-optimum sampling instant "at the centre of the eye pattern", however, leads to more faulty decisions in the Viterbi detector, which it corrects automatically to a certain degree. The error correction will, for the most part, correct the remainder still left over, it being possible for the correction capacity to be quickly exceeded in the case of additional amplitude dips owing to scratches on the tape or blemishes in the tape. The result is then loss of data.

SUMMARY OF THE INVENTION

It is the object of the invention to improve the sampling instant of the overall system.

According to the invention, the Viterbi detector present in the system is extended by a control output, by means of which a variable delay line at the output or inside the PLL is controlled.

Likewise a constituent part of the new method is an algorithm which counts the erroneous decisions already addressed and is started within a defined time interval.

Upon overshooting of a predetermined number of corrected erroneous decisions/time interval, the optimization of the sampling instant is carried out as follows:

(a) a defined switchover to a new delay value is undertaken. The change in the erroneous decisions is evaluated. In the event of an improvement, the next delay value in the same effective direction is tested, and, in the event of a deterioration, the effective direction is switched over.

(b) the occurrence of erroneous decisions is recorded not only in terms of magnitude, but also of position, referred to the respective edge change. In the event of error burst at a specific edge, new delay values are tested in the compensating direction until an optimum is obtained.

After the determination of an optimum, this value is retained until the sum of the erroneous decisions/time interval starts a new optimization.

Signal processing system for digital signals consisting of a clock recovery stage, a clocked sampling stage and a Viterbi detector as decision stage.

The phase of the sampling is displaced by the control output of the Viterbi detector in such a way that the sampling position occurs in the eye aperture position which corresponds to the minimum error rate.

The error rate information is obtained from the sum of erroneous decisions per unit of time which are determined and corrected in the Viterbi detector.

The optimization is automatically started in the event of overshooting of a predetermined high error value and automatically terminated in the event of undershooting a predetermined low error value, the last-determined output value being retained and the optimization being continuously activated. The system is started with a mean value or the system starts with the last-determined, stored output value.

The Viterbi detector, which has control outputs, changes the clock phase at the input of the sampling stage. Present between the clock recovery and sampling is a switchable delay line which is controlled by the Viterbi detector output. The phase of the clock recovery is changed directly by feeding in a phase offset which is controlled by the Viterbi detector output via a digital/analog converter. The sampling stage contains an analog/digital converter.

The optimization operation is constructed iteratively by evaluating each erroneous level transition, by evaluating the error result after switching in a changed sampling position and by starting the next appropriate action.

Advantageous areas of application are all systems which have a PLL for data synchronization, as well as digital signal sampling and a Viterbi detector, particularly in:

Receivers for digital transmission systems (DVB, DSS, ATV, etc.),

Playback electronics of optical storage systems (HDCD, DVD),

Playback electronics of magnetic storage systems

Helical scan recording (DVC-digital video cassette) Longitudinal track recording (SDCR-stationary digital cassette recorder)

Data recording (HDD-hard disk drive)

The invention is explained in the following with reference to the drawing, in which

DETAILED DESCRIPTION OF THE PREFERRED EMBODIMENTS

Figure 1:
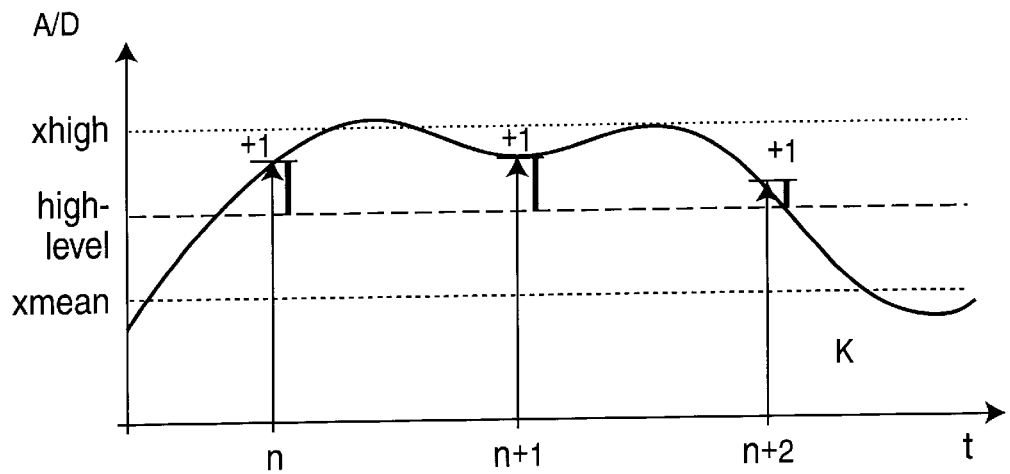
FIG. 1 shows a erroneous decoding of the DVC data signal.

FIG. 1 shows an erroneous decoding of the DVC data signal. The representation shows the sampling instants n, n+1 and n+2 on the time axis T, and the analog/digital converter values A/D with the marked points of xhigh, high-level and xmean. The curve K is also represented.

The representation relates to a ternary signalling scheme in which edge changes are represented as +1 or −1, and the mean level has the value 0. The curve represents a +1 signal jump; any noise components are blanked out. Here, mean represents the mean level value which occurs between edge changes and corresponds to the value 0.

The high-level region is marked, above which a pulse is detected as +1.

The mean value xhigh represents the +1 level. (Logically, the value limits of low-level and xlow exist for evaluating the −1 signal jumps). Only a maximum of 2 sequential +1 and −1 values are permitted, this being prescribed by preceding during recording. In the actual case represented, after checking the level conditions, the Viterbi detector will deduce an erroneous pulse at the instant n+2. At the same time, this error is assigned to the falling edge, in order to facilitate a unique detection of the control direction.

Figure 2:
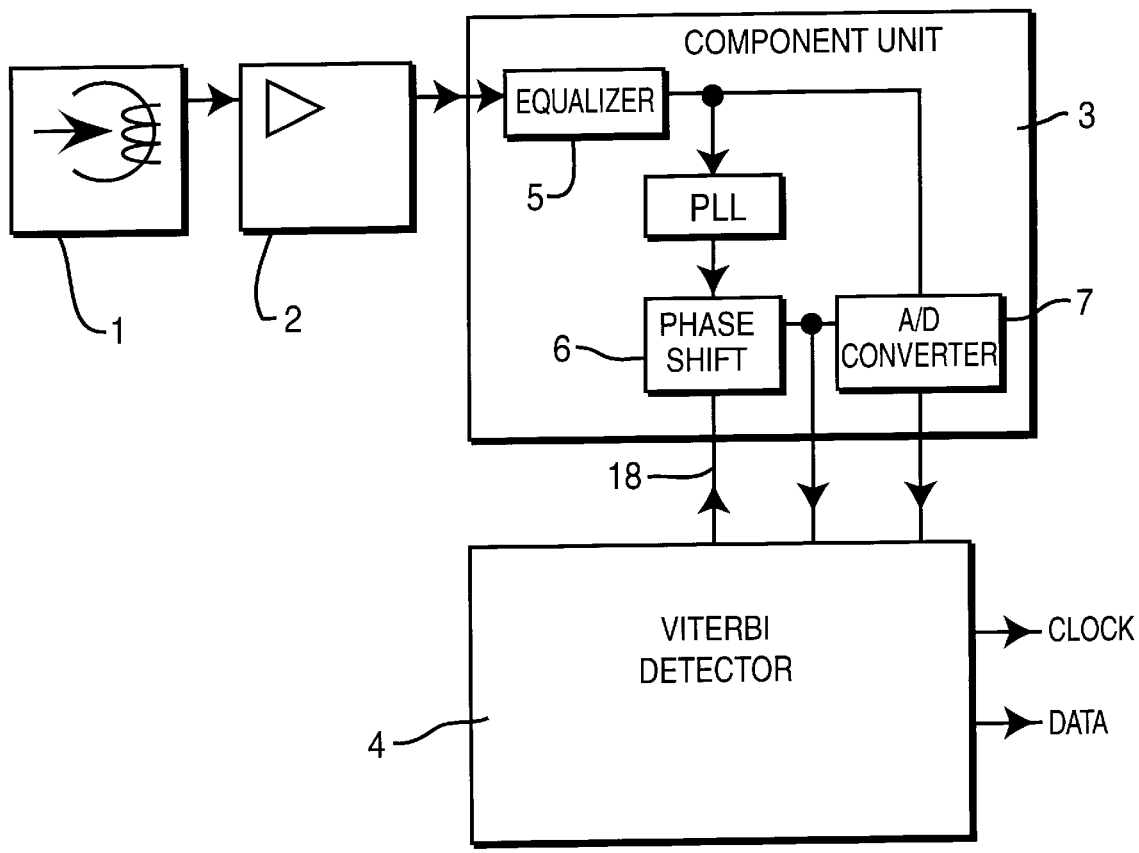
FIG. 2 shows the block diagram of the solution according to the invention.

FIG. 2 shows the playback head 1, the playback amplifier 2, a component unit 3 and the Viterbi detector 4 with the outputs clock and data. The component unit 3 consists of an equalizer 5, a PLL circuit PLL, a phase shifter 6 and an A/D converter 7.

The playback head reads the signal from the tape, which is brought to a level of several 100 mV in the downstream playback amplifier. The equalizer compensates higher-frequency level losses and contains a group delay correction. Signals in accordance with FIG. 1 are available at its output. The PLL circuit is activated by changes in signal edge, the instants of which are compared with the edge changes of a voltage-controlled oscillator (not represented) and synchronized with them. Connected at the output of the PLL is a delay line which can be switched in ns steps. The output of said line feeds the clock input of an A/D converter, at whose input the signal coming from the equalizer is present. The output signals of the converter are fed to the Viterbi detector. In turn, the latter provides the correction value for the clock delay at one output; available at a further output is the data signal which has been decided upon and synchronized with the clock pulse.

Figure 3:
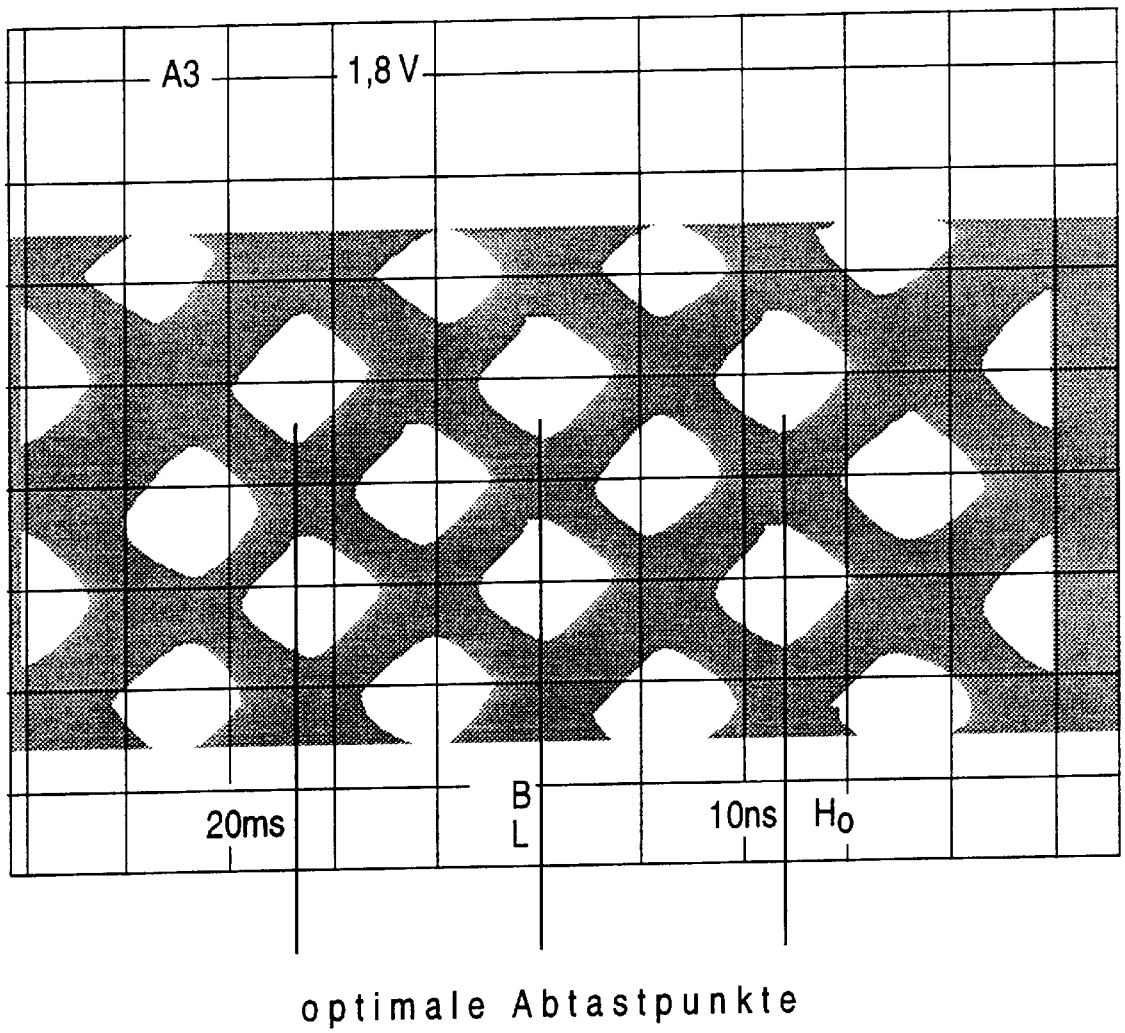
FIG. 3 shows a ternary, correctly equalized PR4 signal, as used in DVC.

FIG. 3 represents an image of an oscillograph with the optimum sampling instants. The representation represents the output signal of the equalizer measured continuously over a relatively long period. This is the eye pattern of a ternary signal. For a minimum error rate, it is necessary to sample at the instant of maximum eye aperture.

Figure 4:
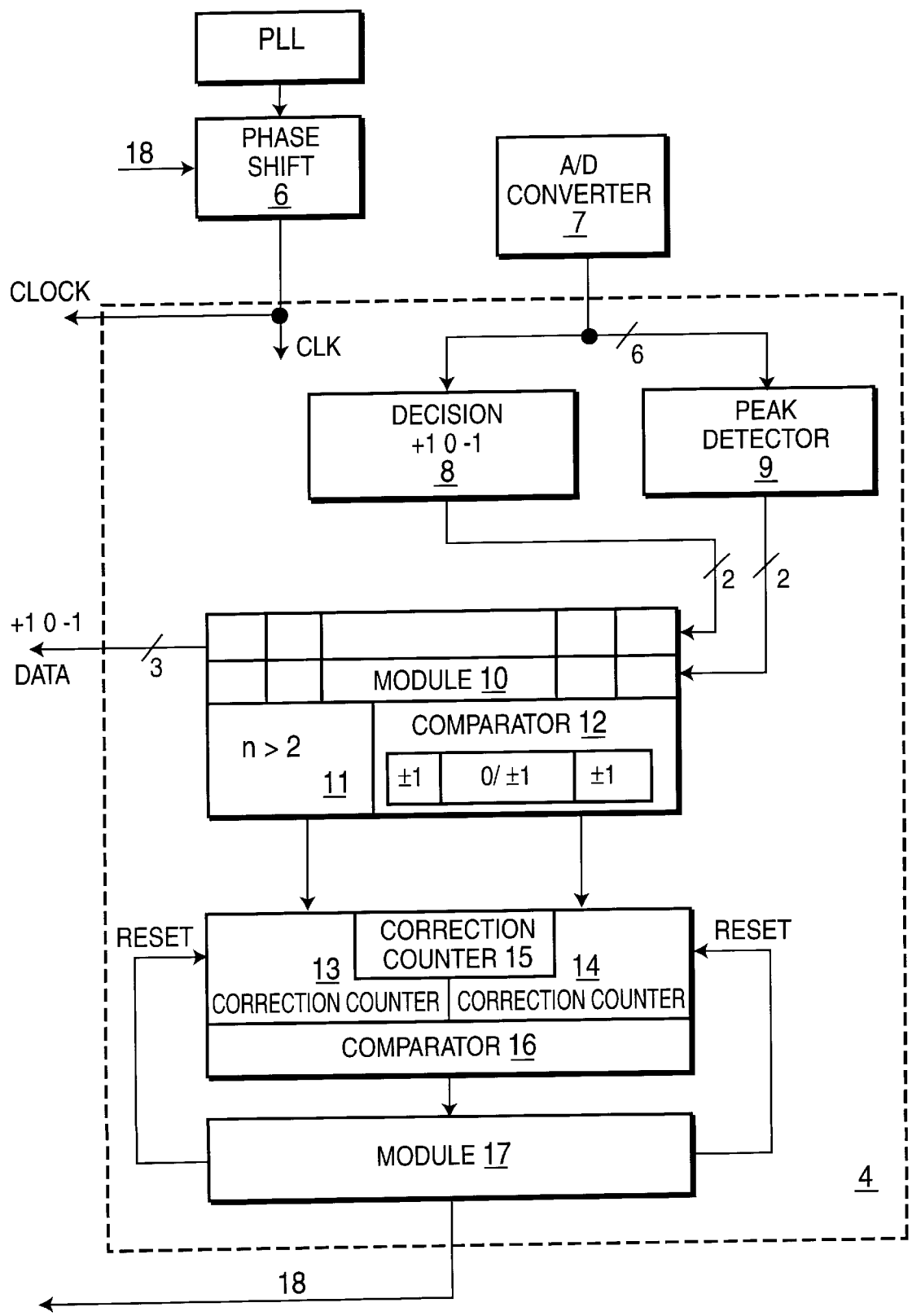
FIG. 4 shows the structure inside the Viterbi detector.

FIG. 4 represents the Viterbi detector 4. It receives from the PLL circuit PLL via phase shifter 6 a clock signal clk and from the A/D converter 7 in each case the converted signal of the equalizer 5 (not represented here). The signal from the A/D converter 7 is relayed to the decision device 8 and the peak value detector 9. The decision for +1; −1 and 0 is taken in the decision device 8 by amplitude evaluation. The two outputs are fed to 2 monitoring shift registers in the module 10. The peak detector 9 measures the levels and marks the transitions with the lowest probability (for example, at the instant n+2 in FIG. 1) separately in accordance with +1 and −1 transitions. These marking bits are fed synchronously with the decider bits to separate monitoring shift registers in the module 10. The impermissible transitions

+1>>0>>+1;−1>>0>>−1; +1>>−1>>+1 −1>>+1>>−1 are detected and corrected in the comparator 12, the contents of the data monitoring register being changed. The counter 11 determines the number of sequential +1 and −1 levels. In accordance with the preceding, a value >2 indicates an error.

The modules 13–17 show the solution according to the invention for the corrections, assigned to the respective edge changes, for an iterative operation.

The edge correction counter 15, which is made up of the correction counter 13 for left-hand edges and correction counter 14 for right-hand edges, counts the corrections occurring per unit time (for example, number of clock cycles). The comparator 16 determines the direction of correction and starts or terminates the operation by counting the absolute corrections. The output signal is provided in the module 17, and the edge count is reset there after the output.

The two units give the evaluated signal to a monitoring shift register 10. The monitoring shift register 10 is connected to the counter 11 and the comparator 12. The counter 11 relays its evaluation to the left-hand edge 13, and the comparator 12 relays its evaluation to the right-hand edge 14. The left-hand edge 13 and the right-hand edge 14 contain an edge correction counter 15, and these three units are combined in a next comparator 16. The comparator 16 is connected to the phase shifter controller 17, which in each case relays a reset signal. The phase shifter controller 17 has a serial output 18 which may be used to control a delay circuit in phase shifter 6. Phase shifter 6 may include, for example, apparatus of the type described in U.S. Pat. No. 5,448,205—Rothermel for providing phase control using a variable delay line.

The invention claimed is:

1. Apparatus for reconverting digital data by sampling a recorded analog signal, comprising:

a clock recovery stage, said clock recovery stage being a PLL circuit which is activated by changes in signal edge of the recorded analog signal, a clocked sampling stage, a Viterbi detector as a decision stage, a controllable delay line which receives a clock signal from the PLL circuit, said Viterbi detector comprising:

an input for the clock signal from the controllable delay line and an input for a converted signal from the clocked sampling stage, decision means for deciding which of a number of values is to be assigned to each sample, error correction means responsive to the decision means for marking and correcting the samples which are falsified according to given error correcting rules, counting means responsive to the error correction means for counting corrected errors, and phase shift controller means responsive to the counting means for generating phase control signals when an error rate exceeds a given value, said phase control signals being coupled to said controllable delay line.

2. Apparatus according to claim 1 wherein the counting means includes means for separately counting corrected errors for left-hand edges and right-hand edges of the recorded analog signal and comparator means are provided for comparing the results of counting left-hand edge errors and the results of counting right-hand edge errors, for determining the direction of phase shift control for the phase shift controller means.

3. Apparatus according to claim 1, wherein the error rate corresponds to the sum of the corrected errors per unit time in the Viterbi detector.

* * * * *